United States Patent
Yu et al.

(10) Patent No.: US 9,368,412 B2
(45) Date of Patent: Jun. 14, 2016

(54) METHOD FOR MANUFACTURING SEMICONDUCTOR DEVICE

(71) Applicants: Semiconductor Manufacturing International (Beijing) Corporation, Beijing (CN); Semiconductor Manufacturing International (Shanghai) Corporation, Shanghai (CN)

(72) Inventors: Yunchu Yu, Shanghai (CN); Yihua Shen, Shanghai (CN); Fenghua Fu, Shanghai (CN)

(73) Assignees: SEMICONDUCTOR MANUFACTURING INTERNATIONAL (BEIJING) CORPORATION (CN); SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/723,346

(22) Filed: May 27, 2015

(65) Prior Publication Data
US 2015/0371903 A1 Dec. 24, 2015

(30) Foreign Application Priority Data
Jun. 20, 2014 (CN) .......................... 2014 1 0281295

(51) Int. Cl.
*H01L 21/8238* (2006.01)
*H01L 21/033* (2006.01)
*H01L 21/285* (2006.01)

(52) U.S. Cl.
CPC .... *H01L 21/823814* (2013.01); *H01L 21/0337* (2013.01); *H01L 21/28518* (2013.01); *H01L 21/823821* (2013.01); *H01L 21/823871* (2013.01)

(58) Field of Classification Search
None
See application file for complete search history.

(56) References Cited

U.S. PATENT DOCUMENTS

| 2014/0306291 A1* | 10/2014 | Alptekin | H01L 29/41725 257/369 |
| 2014/0349459 A1* | 11/2014 | Cheng | H01L 21/823807 438/300 |
| 2015/0214058 A1* | 7/2015 | Basker | H01L 21/283 257/769 |

* cited by examiner

*Primary Examiner* — Asok K Sarkar
(74) *Attorney, Agent, or Firm* — Innovation Counsel LLP

(57) ABSTRACT

A method for manufacturing one or more semiconductor devices may include the following steps: providing a dielectric layer on a substrate structure that includes a first electrode and a second electrode; providing a first mask on the dielectric layer; providing a second mask, which overlaps the first mask and has a designated structure, wherein a portion of the first mask is positioned between a first portion and a second portion of the designated structure in a layout view of a process structure that includes the first mask and the second mask; and performing a removal process through the first portion of the designated structure and through the second portion of the designated structure to form a first contact hole and a second contact hole in a remaining portion of the dielectric layer, wherein the two contact holes expose the two electrodes, respectively.

20 Claims, 13 Drawing Sheets

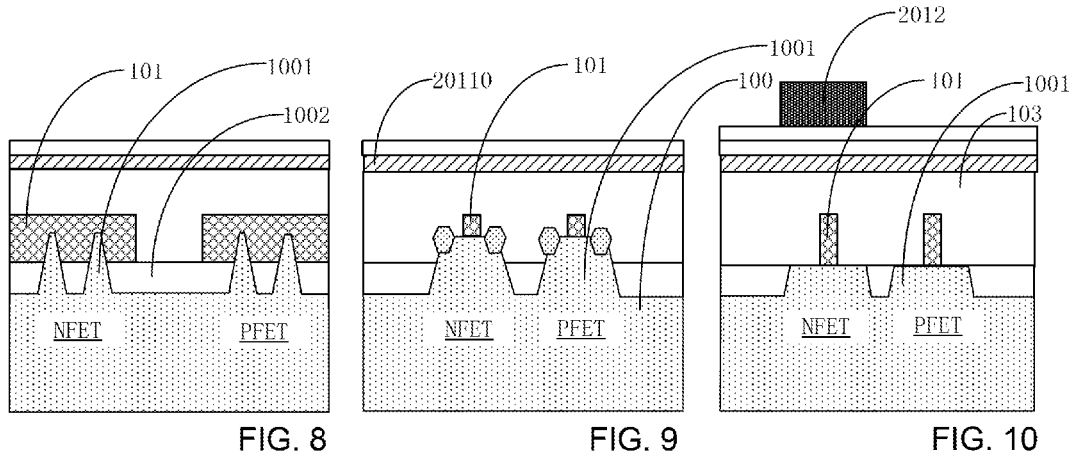

METHOD FOR MANUFACTURING SEMICONDUCTOR DEVICE

CROSS-REFERENCE TO RELATED APPLICATION

This application claims priority to and benefit of Chinese Patent Application No. 201410281295.4, filed on 20 Jun. 2014; the Chinese Patent Application is incorporated herein by reference in its entirety.

BACKGROUND OF THE INVENTION

The present invention is related to a method for manufacturing a semiconductor device.

In a process of manufacturing a semiconductor device, contact holes may be implemented for accommodating interconnect elements used for electrically connecting circuit elements. Configurations of the contact holes may significantly affect configurations of the interconnect elements. In order to satisfy various design requirements, multiple process steps may be required for implementing the contact holes. Generally, the control of the process steps and associated results may be substantially difficult.

SUMMARY

An embodiment of the present invention may be related to a method for manufacturing one or more semiconductor devices. The method may include the following steps: providing a dielectric layer on a substrate structure, wherein the substrate structure may include a first electrode and a second electrode; providing a first mask on the dielectric layer; providing a second mask, which may overlap the first mask and may have a first designated structure, wherein a portion of the first mask may be positioned between a first portion of the first designated structure and a second portion of the first designated structure in a layout view of a process structure that includes the substrate structure, the dielectric layer, the first mask, and the second mask; and performing a first removal process through the first portion of the first designated structure and through the second portion of the first designated structure for removing portions of the dielectric layer to form a first contact hole and a second contact hole in a first remaining dielectric layer, which is a remaining portion of the dielectric layer, wherein the first contact hole and the second contact hole may expose the first electrode and the second electrode, respectively.

The first mask may be formed of a first material. The second mask may be formed of a second material. The second material may be different from the first material. The first mask may be formed of titanium nitride. The second mask may be formed of a photoresist material.

The first designated structure (and/or an edge of the first designated structure) may intersect (at least an edge of) the first electrode and (at least an edge of) the second electrode in the layout view of the process structure.

The method may include the following steps: configuring the first electrode to be an active region electrode (e.g., a source electrode or a drain electrode) of a first semiconductor device; and configuring the second electrode to be an active region electrode (e.g., a source electrode or a drain electrode) of a second semiconductor device.

The method may include the following steps: configuring the first electrode to be an active region electrode of a first transistor; and configuring the second electrode to be an active region electrode of a second transistor.

The first designated structure may expose the portion of the first mask during the first removal process.

The portion of the first mask may directly contact a protected portion of the dielectric layer. The portion of the first mask may protect the protected portion of the dielectric layer during the first removal process.

Each of a first edge of the first mask and a second edge of the first mask may intersect two edges of the first designated structure in the layout view of the process structure. The first edge of the first mask and the two edges of the first designated structure may define shapes of two corners of the first contact hole. The second edge of the first mask and the two edges of the first designated structure may define shapes of two corners of the second contact hole.

The substrate structure may include a first fin structure and a second fin structure. The first mask may be positioned between the first fin structure and the second fin structure in the layout view of the process structure.

The first designated structure may intersect each of the first fin structure and the second fin structure in the layout view of the process structure.

The substrate structure may further include a third fin structure. The first designated structure may further intersect the third fin structure in the layout view of the process structure.

The method may include the following steps: forming an intervening layer on the first mask before forming the second mask. The second mask may be formed on the intervening layer. The intervening layer may include at least one of a sacrificial layer and an antireflection layer.

The method may include the following steps: providing a first mask material layer on the dielectric layer; providing a photoresist layer on the first mask material layer; providing a pattern mask on the photoresist layer; processing the photoresist layer through the pattern mask to form a patterned photoresist layer; and processing the first mask material layer through the patterned photoresist layer to form the first mask.

The method may include the following steps: providing a first metal silicide element in the first contact hole; and providing a second metal silicide element in the second contact hole.

The method may include the following steps: removing the second mask; removing the first mask after the second mask has been removed; providing a third mask on the first remaining dielectric layer after the first mask has been removed, wherein the third mask may have a second designated structure; and processing the first remaining dielectric layer through the second designated structure to form a third contact hole in a second remaining dielectric layer, which is a remaining portion of the first remaining dielectric layer. The third contact hole may expose a third electrode included in the substrate structure.

The first mask may intersect the third electrode in the layout view of the process structure before the first mask may be removed.

The lengthwise direction of the second designated structure may be parallel to the lengthwise direction of the first mask.

The lengthwise direction of the second designated structure may be perpendicular to the lengthwise direction of the first designated structure.

The method may include simultaneously depositing a same conductive material in all of the first contact hole, the second contact hole, and the third contact hole. The conductive material may be a metal material, such as tungsten. The method may include performing a polishing process to remove excess metal material, which may be positioned outside the contact holes.

According to embodiments of the invention, in a process for manufacturing semiconductor devices, a mask (e.g., the aforementioned first mask) and an overlying designated structure (e.g., the aforementioned first designated structure) may substantially simplify the control of both contact hole spacings and contact hole corner shapes. Therefore, design requirements of semiconductor devices may be effectively satisfied. Advantageously, satisfactory quality of semiconductor devices may be substantially attained, and a satisfactory yield of the manufacturing process may be substantially achieved.

The above summary is related to some of many embodiments of the invention disclosed herein and is not intended to limit the scope of the invention.

BRIEF DESCRIPTION OF THE DRAWINGS

FIG. 8, FIG. 9, and FIG. 10 show schematic diagrams (e.g., schematic cross-sectional views) that illustrate a process structure formed in a process of manufacturing one or more semiconductor devices in accordance with one or more embodiments of the present invention.

DETAILED DESCRIPTION

Figure 1:
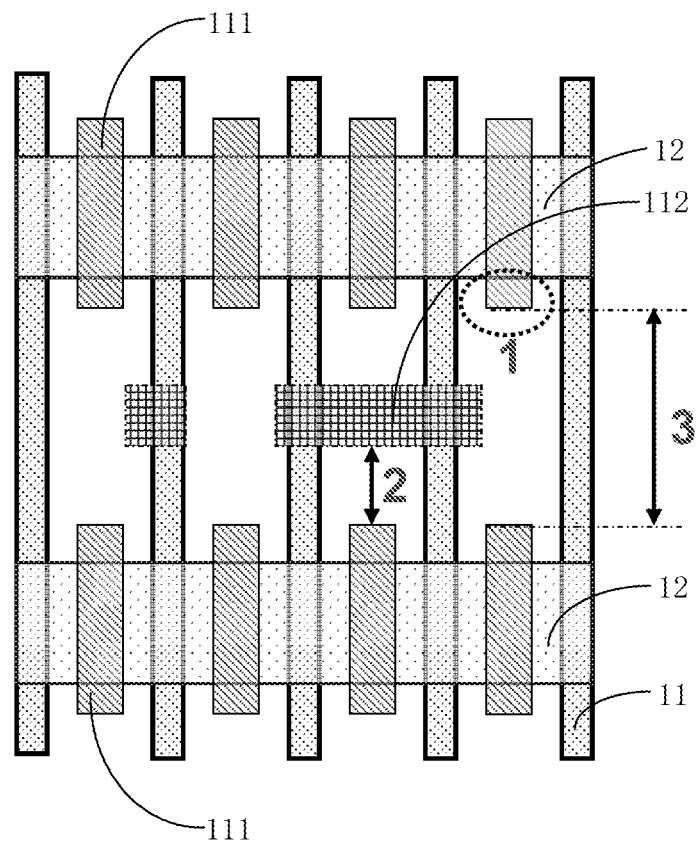
FIG. 1 shows a schematic diagram (e.g., a schematic layout view) that illustrates a method for manufacturing a semiconductor device in accordance with one or more embodiments of the present invention.

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive"

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

FIG. 1 shows a schematic diagram (e.g., a schematic layout view) that illustrates a method for manufacturing a semiconductor device in accordance with one or more embodiments of the present invention. The method may include using a mask that has designated structures 111 (e.g. openings) for forming active region contact holes in an interlayer dielectric layer. The active region contact holes may be used for implementing respective electrical connections to active region electrodes 12, such as a source electrode and a drain electrode. The method may further include using a mask that has a designated structure 112 (e.g., an opening) for forming a gate contact hole. The gate contact hole may be used for implementing an electrical connection to a gate electrode 11. In the manufacturing process of the semiconductor device, unwanted corner rounding of a gate contact hole at the indicated region 1 may need to be minimized, unwanted bridging between (conductive material disposed in) an active region contact hole and (conductive material disposed in) a gate contact hole at the indicated region 2 may need to be prevented, and a distance between active region contact holes in the indicated region 3 may need to be properly controlled.

Figure 2:
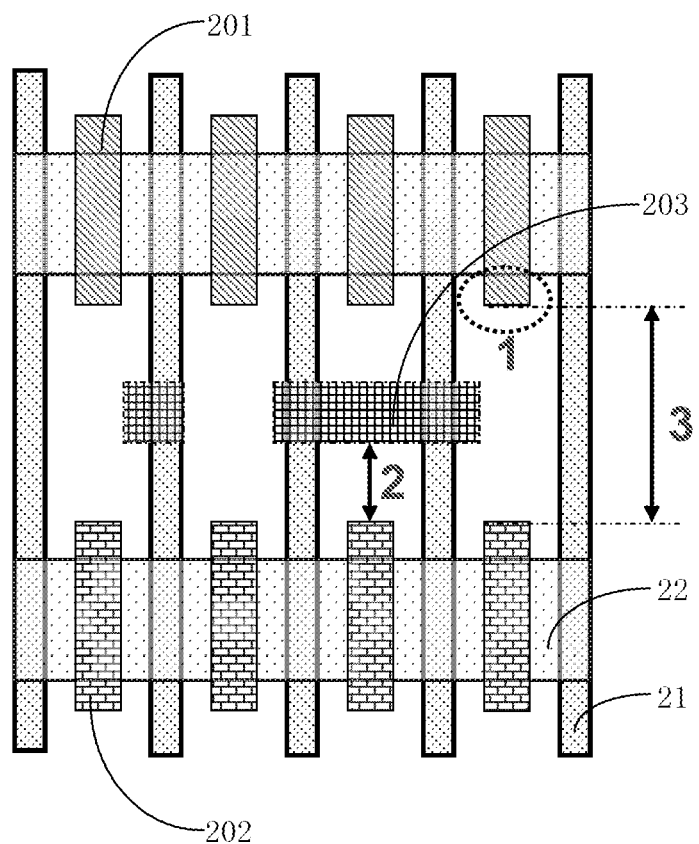
FIG. 2 shows a schematic diagram (e.g., a schematic layout view) that illustrates a method for manufacturing a semiconductor device in accordance with one or more embodiments of the present invention.

FIG. 2 shows a schematic diagram (e.g., a schematic layout view) that illustrates a method for manufacturing a semiconductor device in accordance with one or more embodiments of the present invention. The method may include using both a mask that has a designated structure 201 (e.g., an opening) and a mask that has a designated structure 202 (e.g., an opening) for forming active region contact holes in an interlayer dielectric layer. The active region contact holes may be used for implementing respective electrical connections to active region electrodes 12, such as a source electrode and a drain electrode. The method may further include using a mask that has a designated structure 203 (e.g., an opening) for forming a gate contact hole. The gate contact hole may be used for implementing an electrical connection to a gate electrode 21. In the manufacturing process of the semiconductor device, unwanted corner rounding of a gate contact hole at the indicated region 1 may need to be minimized, unwanted bridging between (conductive material disposed in) an active region contact hole and (conductive material disposed in) a gate contact hole at the indicated region 2 may need to be prevented, and a distance between active region contact holes in the indicated region 3 may need to be properly controlled.

Figure 3:
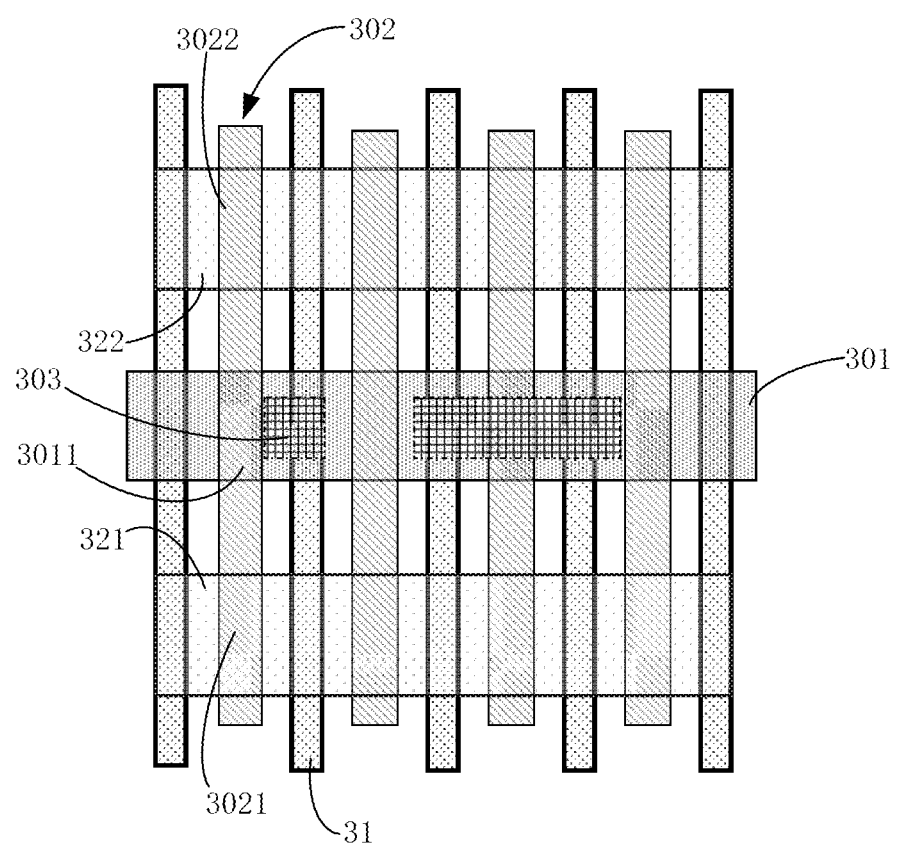
FIG. 3 shows a schematic diagram (e.g., a schematic layout view) that illustrates a method for manufacturing one or more semiconductor devices in accordance with one or more embodiments of the present invention.
Figure 32:
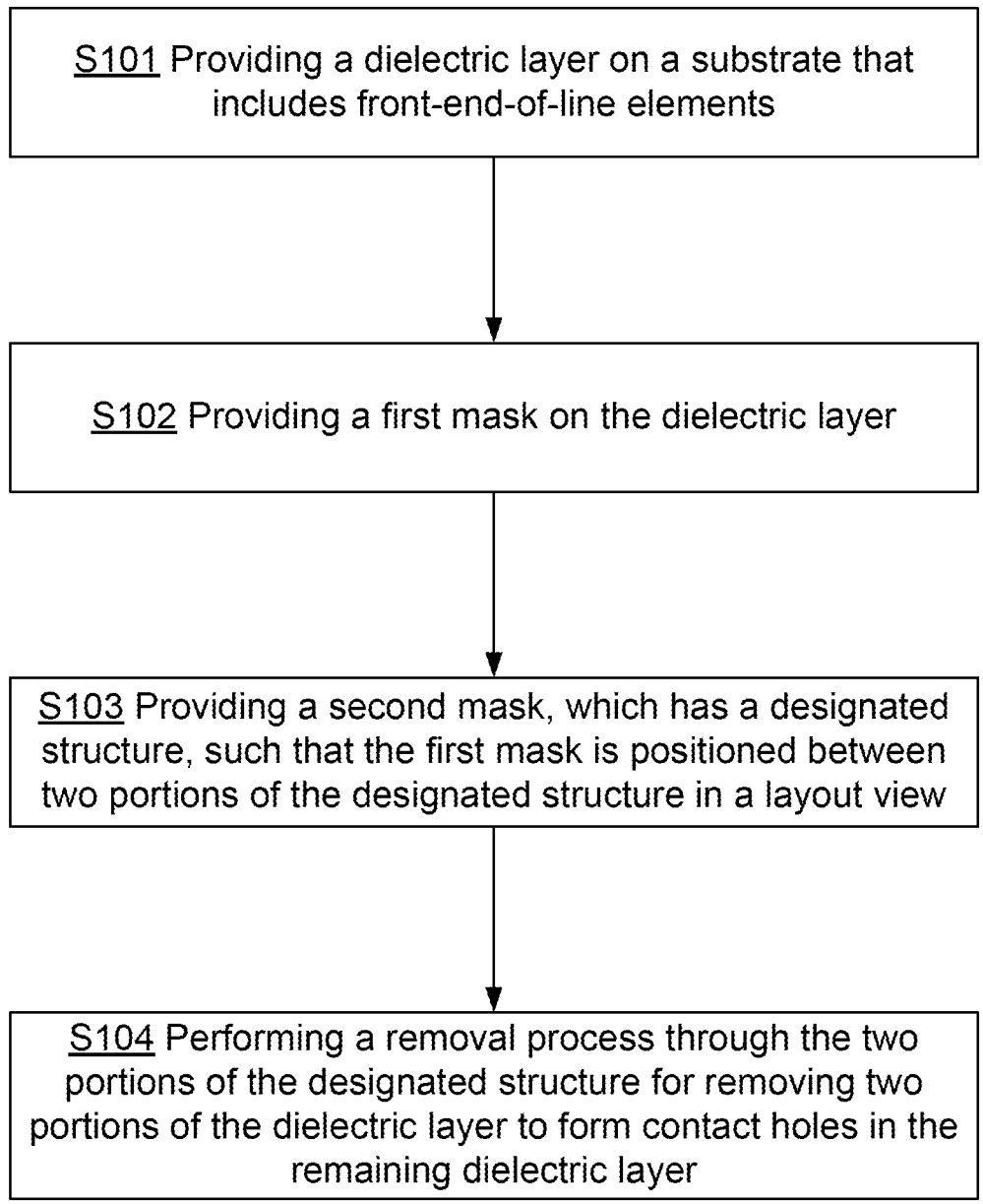
FIG. 32 shows a flowchart that illustrates steps in a method for manufacturing one or more semiconductor devices in accordance with one or more embodiments of the present invention.

FIG. 3 shows a schematic diagram (e.g., a schematic layout view) that illustrates a method for manufacturing one or more semiconductor devices in accordance with one or more embodiments of the present invention. FIG. 32 shows a flowchart that illustrates steps in the method for manufacturing one or more semiconductor devices in accordance with one or more embodiments of the present invention.

Referring to FIG. 32 and FIG. 3, the method may include a step S101, providing a dielectric layer on a substrate structure, such as a front-end-of-line (FEOL) structure that includes FEOL elements. The FEOL elements may include a first electrode 321, a second electrode 322, and a third electrode 31. For example, each of the first electrode 321 and the second electrode 322 may be an active region electrode, such as a source electrode or a drain electrode; the third electrode 31 may be a gate electrode. The dielectric layer may be analogous to a dielectric layer 103 illustrated in FIGS. 5, 6, and 7. In an embodiment, the first electrode 321 may be implemented to be a component of a first semiconductor device, and the second electrode 322 may be implemented to be a component of a second semiconductor device.

The method may further include a step S102 (subsequent to the step S101), providing a first mask 301 on the dielectric layer. The first mask 301 may be positioned between the first electrode 321 and the second electrode 322 in a layout view (e.g., a top view) process structure that includes the substrate, the dielectric layer, and the mask 301.

The method may further include a step S103 (subsequent to the step S102), providing a second mask, which may overlap the first mask 301 and may have a first designated structure 302 (e.g., an opening or a transparent structure), such that (two edges of) the first designated structure 302 may intersect and/or may be perpendicular to (two edges of) the first mask in a layout view (e.g., a top view) of a process structure that includes the substrate, the dielectric layer, the first mask 301 and the second mask. The first designated structure 302 (and/or at least an edge of the first designated structure 302) may intersects (at least an edge of) the first electrode 321 and (at least an edge of) the second electrode 322 in the layout view (e.g., a top view) of the process structure. A portion 3011 of the first mask 301 may be positioned between a first portion 3021 of the first designated structure 302 and a second portion 3022 of the designated structure 302 in the layout view of the process structure. The second mask may have other designated structures that are analogous to the first designated structure 302 and have portions corresponding to other electrodes included in the substrate.

The method may further include S104 (subsequent to the step S103), performing a removal process (e.g., an etching process) through the first portion 3021 of the first designated structure 302 and through the second portion 3022 of the designated structure 302 for removing two portions of the dielectric layer to form a first contact hole and a second contact hole in the remaining dielectric layer. The first contact hole and the second contact hole may expose the first electrode 321 and the second electrode 322, respectively, and may be used for implementing respective electrical connections to the first electrode 321 and the second electrode 322, respectively.

The method may further include, subsequent to the step S104, using a mask that has a designated structure 303 (e.g., an opening or a transparent structure) for forming a third contact hole, which may expose the third electrode 31. The third contact hole may be used for implementing electrical connection to the third electrode 31.

During the removal process performed for forming the first contact hole and the second contact hole, the portion 3011 of the first mask 301 may be exposed by the first designated structure 302 and may substantially prevent a corresponding portion of the underlying dielectric layer from being etched. As a result, the spacing between the first contact hole and the second contact hole may be substantially precisely implemented, and the spacing between the subsequently formed third contact hole and each of the first contact hole and the second contact hole may be substantially precisely implemented. Therefore, unwanted bridging between contact holes and/or associated conductive material(s) may be substantially prevented.

During the removal process performed for forming the first contact hole and the second contact hole, the intersections between edges of the first mask 301 and edges of the first designated structure 302 may effectively define the shapes of the corresponding corners of the first contact hole and the second contact hole. A first edge of the first mask 301 and two edges of the first designated structure 302 may define the shapes of two corners of the first contact hole, and a second edge of the first mask 301 and the two edges of the first designated structure 302 may define the shapes of two corners of the second contact hole. Therefore, unwanted corner rounding may be substantially prevented.

According to embodiments of the invention, control of contact hole spacing and contact hole corner shapes may be substantially simplified. As a result, design requirements of semiconductor devices may be substantially satisfied. Advantageously, satisfactory quality of semiconductor devices may be substantially attained, and a satisfactory yield of the related manufacturing process may be substantially achieved.

Figure 4:
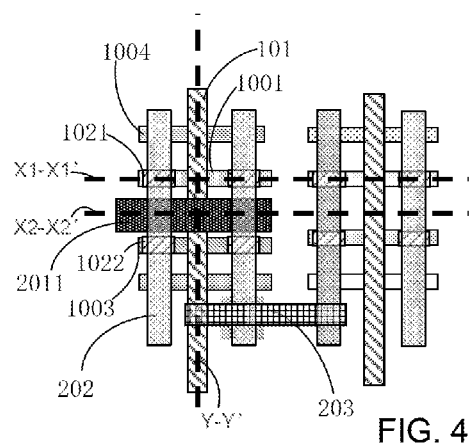
FIG. 4 shows a schematic diagram (e.g., a schematic layout view) that illustrates a method for manufacturing one or more semiconductor devices in accordance with one or more embodiments of the present invention.
Figure 5:
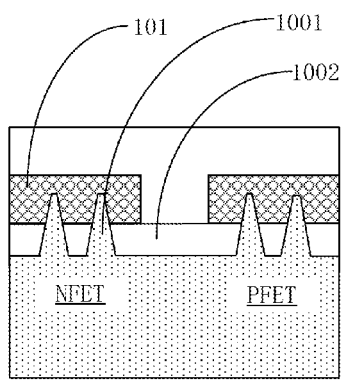
FIG. 5, FIG. 6, and FIG. 7 show schematic diagrams (e.g., schematic cross-sectional views) that illustrate a process structure formed in a process of manufacturing one or more semiconductor devices in accordance with one or more embodiments of the present invention.
Figure 6:
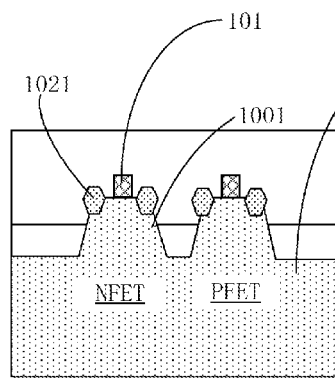
Figure 7:
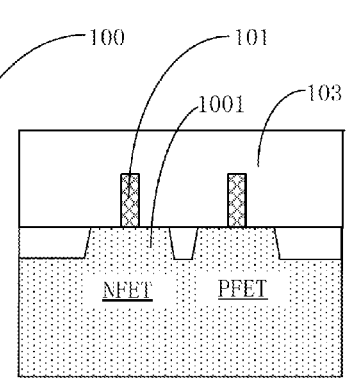
Figure 11:
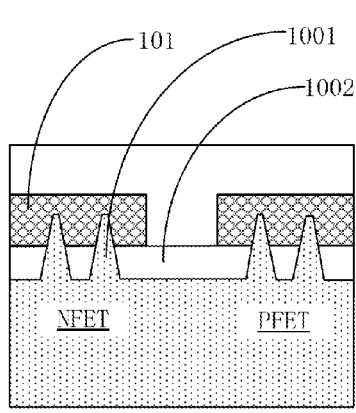
FIG. 11, FIG. 12, and FIG. 13 show schematic diagrams (e.g., schematic cross-sectional views) that illustrate a process structure formed in a process of manufacturing one or more semiconductor devices in accordance with one or more embodiments of the present invention.
Figure 12:
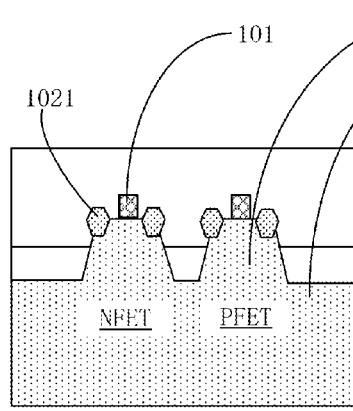
Figure 13:
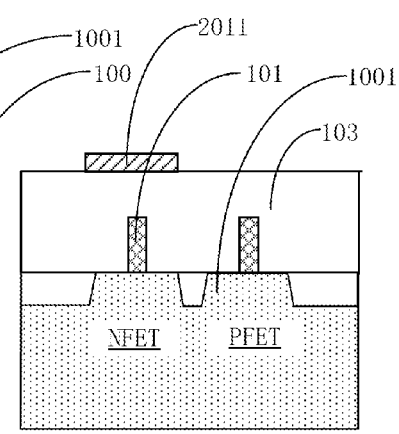
Figures 14, 15, 16:
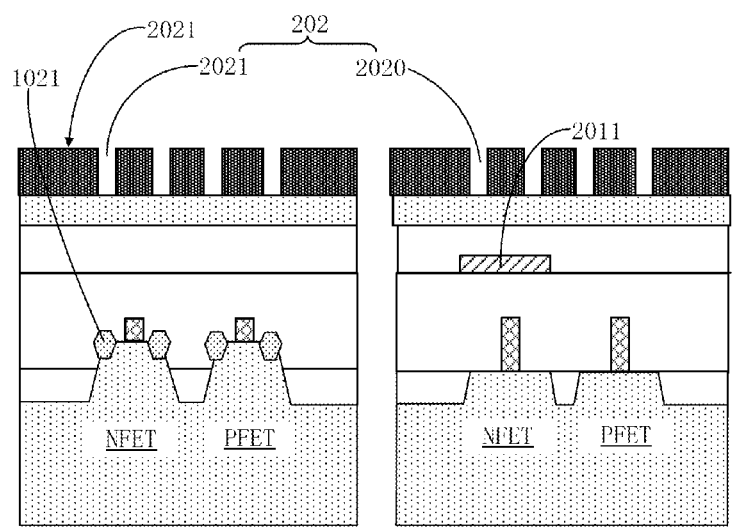
FIG. 14, FIG. 15, and FIG. 16 show schematic diagrams (e.g., schematic cross-sectional views) that illustrate a process structure formed in a process of manufacturing one or more semiconductor devices in accordance with one or more embodiments of the present invention.
Figure 17:
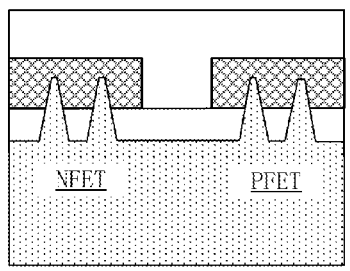
FIG. 17, FIG. 18, and FIG. 19 show schematic diagrams (e.g., schematic cross-sectional views) that illustrate a process structure formed in a process of manufacturing one or more semiconductor devices in accordance with one or more embodiments of the present invention.
Figure 18:
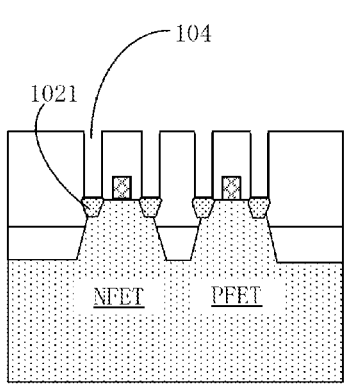
Figure 19:
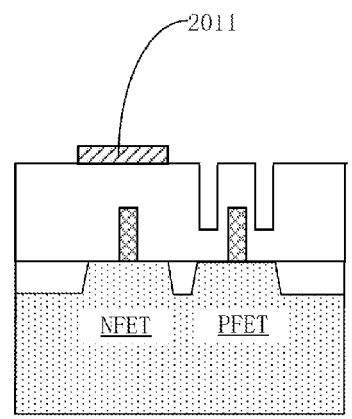
Figure 20:
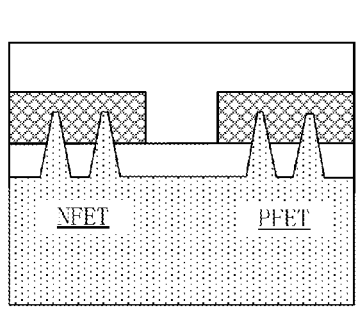
FIG. 20, FIG. 21, and FIG. 22 show schematic diagrams (e.g., schematic cross-sectional views) that illustrate a process structure formed in a process of manufacturing one or more semiconductor devices in accordance with one or more embodiments of the present invention.
Figure 21:
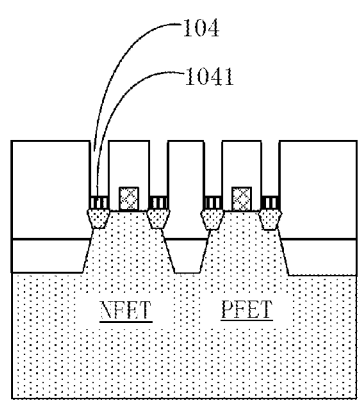
Figure 22:
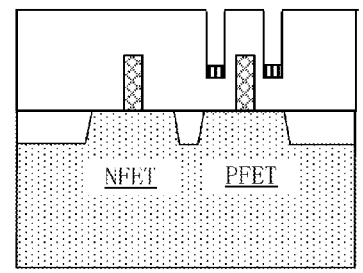
Figure 23:
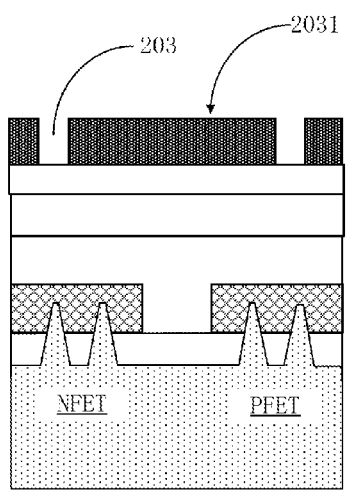
FIG. 23, FIG. 24, and FIG. 25 show schematic diagrams (e.g., schematic cross-sectional views) that illustrate a process structure formed in a process of manufacturing one or more semiconductor devices in accordance with one or more embodiments of the present invention.
Figure 24:
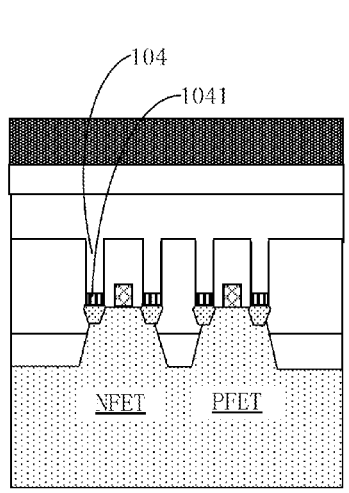
Figure 25:
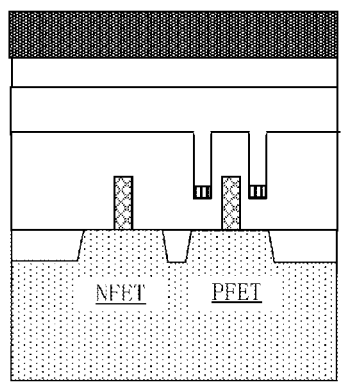
Figure 26:
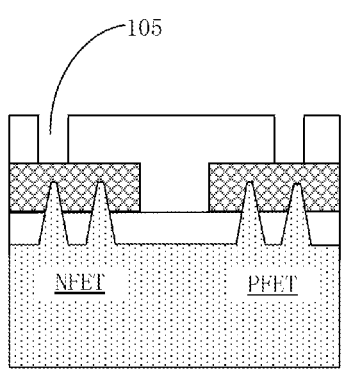
FIG. 26, FIG. 27, and FIG. 28 show schematic diagrams (e.g., schematic cross-sectional views) that illustrate a process structure formed in a process of manufacturing one or more semiconductor devices in accordance with one or more embodiments of the present invention.
Figure 27:
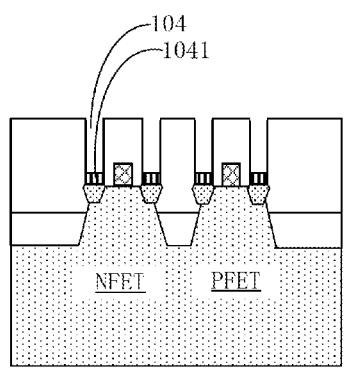
Figure 28:
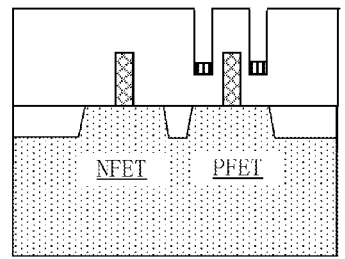
Figure 29:
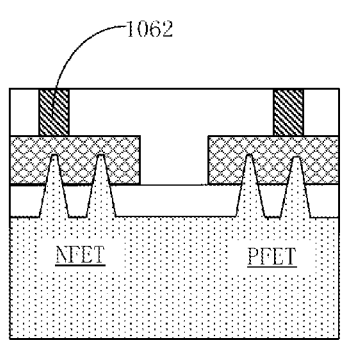
FIG. 29, FIG. 30, and FIG. 31 show schematic diagrams (e.g., schematic cross-sectional views) that illustrate a process structure formed in a process of manufacturing one or more semiconductor devices in accordance with one or more embodiments of the present invention.
Figure 30:
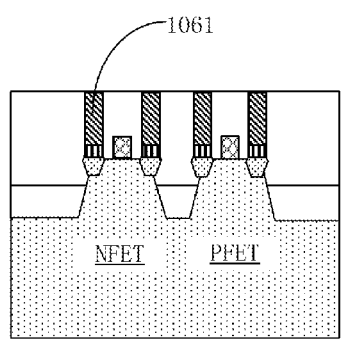
Figure 31:
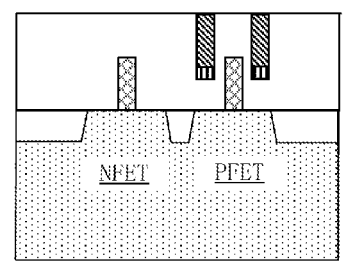

FIG. 4 shows a schematic diagram (e.g., a schematic layout view) that illustrates a method for manufacturing one or more semiconductor devices in accordance with one or more embodiments of the present invention. FIG. 5, FIG. 6, and FIG. 7 show schematic diagrams (e.g., schematic cross-sectional views) that illustrate a process structure formed in a process of manufacturing one or more semiconductor devices in accordance with one or more embodiments of the present invention. FIG. 8, FIG. 9, and FIG. 10 show schematic diagrams (e.g., schematic cross-sectional views) that illustrate a process structure formed in the process of manufacturing one or more semiconductor devices in accordance with one or more embodiments of the present invention. FIG. 11, FIG. 12, and FIG. 13 show schematic diagrams (e.g., schematic cross-sectional views) that illustrate a process structure formed in the process of manufacturing one or more semiconductor devices in accordance with one or more embodiments of the present invention. FIG. 14, FIG. 15, and FIG. 16 show schematic diagrams (e.g., schematic cross-sectional views) that illustrate a process structure formed in the process of manufacturing one or more semiconductor devices in accordance with one or more embodiments of the present invention. FIG. 17, FIG. 18, and FIG. 19 show schematic diagrams (e.g., schematic cross-sectional views) that illustrate a process structure formed in the process of manufacturing one or more semiconductor devices in accordance with one or more embodiments of the present invention. FIG. 20, FIG. 21, and FIG. 22 show schematic diagrams (e.g., schematic cross-sectional views) that illustrate a process structure formed in the process of manufacturing one or more semiconductor devices in accordance with one or more embodiments of the present invention. FIG. 23, FIG. 24, and FIG. 25 show schematic diagrams (e.g., schematic cross-sectional views) that illustrate a process structure formed in the process of manufacturing one or more semiconductor devices in accordance with one or more embodiments of the present invention. FIG. 26, FIG. 27, and FIG. 28 show schematic diagrams (e.g., schematic cross-sectional views) that illustrate a process structure formed in the process of manufacturing one or more semiconductor devices in accordance with one or more embodiments of the present invention. FIG. 29, FIG. 30, and FIG. 31 show schematic diagrams (e.g., schematic cross-sectional views) that illustrate a process structure formed in the process of manufacturing one or more semiconductor devices in accordance with one or more embodiments of the present invention. FIGS. 5, 8, 11, 14, 17, 20, 23, 26, and 29 may represent schematic diagrams (e.g., schematic cross-sectional views) taken along a line Y-Y' indicated in FIG. 4. FIGS. 6, 9, 12, 15, 18, 21, 24, 27, and 30 may represent schematic diagrams (e.g., schematic cross-sectional views) taken along a line X1-X1' indicated in FIG. 4. FIGS. 7, 10, 13, 16, 19, 22, 25, 28, and 31 may represent schematic diagrams (e.g., schematic cross-sectional views) taken along a line X2-X2' indicated in FIG. 4.

Referring to FIGS. 4, 5, 6, and 7, the method may include providing a substrate structure, such as front-end-of-line (FEOL) structure that includes FEOL elements. The substrate structure may include a substrate 100 (e.g., a semiconductor substrate), a first electrode 1021, a second electrode 1022, a third electrode 101, a fin structure 1001, a fin structure 1003, a fin structure 1004, and a shallow trench isolation structure 1002. The substrate 100 may include a negative channel field effect transistor region NFET and a positive channel field effect transistor region PFET. Each of the first electrode 1021 and the second electrode 1022 may be an active region electrode, such as a source electrode or a drain electrode. The third electrode 101 may be a gate electrode. In an embodiment, the first electrode 1021 may be implemented to be a component of a first semiconductor device, and the second electrode 1022 may be implemented to be a component of a second semiconductor device.

The method may include providing a dielectric layer 103 on the substrate structure.

Referring to FIGS. 4, 5, 6, 7, 8, 9, and 10, the method may include the following steps: forming a first mask material layer 20110 on the dielectric layer 103; forming a photoresist layer on the first mask material layer 20110; and patterning (e.g., through exposure and/or development) the photoresist layer to form a patterned photoresist layer 2012.

The patterning of the photoresist layer may include the following steps: forming a first pattern mask on the photoresist layer; and removing (e.g., through etching) one or more portions of the photoresist layer not protected by the first pattern mask.

The first mask material layer 20110 may be formed of one or more of titanium nitride (TiN) and other suitable materials. One or more intervening layers, e.g., an antireflection layer, may be formed on the first mask material layer 20110 before the formation of the photoresist layer.

Referring to FIGS. 4, 8, 9, 10, 11, 12, and 13, the method may include the following steps: removing (e.g., through etching) one or more portions of the first mask material layer 20110 not protected by the patterned photoresist layer 2012 to form a first mask 2011; and removing the patterned photoresist layer 2012 (and removing the one or more intervening layers underlying the patterned photoresist layer 2012).

The first mask 2011 may extend perpendicular to the third electrode 101 and may be positioned between the first electrode 1021 and the second electrode 1022 in a layout view (e.g., a top view) of a process structure that includes the first mask 2011. Being a portion of the first mask material layer 20110, the first mask 2011 may be formed of one or more of titanium nitride (TiN) and other suitable materials.

Referring to FIGS. 4, 11, 12, 13, 14, 15, and 16 the method may include the following steps: forming a second mask material layer, which may overlap (and cover) the dielectric layer 103 and the first mask 2011; patterning the second mask material layer to form a second mask 2021, which may include a designated structure 202 (e.g., an opening or a transparent structure) and may include other designated structures analogous to the designated structure 202.

The patterning of the second mask material layer may include the following steps: forming a second pattern mask on the second mask material layer; and removing (e.g., through etching) one or more portions of the second mask material layer not protected by the second pattern mask.

A first portion 2021 of the designated structure 202 which may correspond to (and may be positioned over) the first electrode 1021. Analogously, the second portion of the designated structure 202 may correspond to (and may be positioned over) the second electrode 1022. A third portion 2020 of the designated structure 202 may correspond to (and may be positioned over) a portion of the first mask 2011. The portion of the first mask 2011 may be positioned between the first portion 2021 of the designated structure 202 and the second portion of the designated structure 202 in a layout view (e.g., a top view) of a process structure that includes the second mask 2021.

One or more computer-implemented simulation processes, such as an optical proximity correction (OPC) process, may be performed in the process step of patterning the second mask material layer.

The second mask 2021 (which has the designated structure 202) may be formed of one or more of a photoresist material and other suitable materials.

The designated structure 202 of the second mask 2021 may intersect each of the fin structure 1001, the fin structure 1003, and the fin structure 1004 in a layout view of a process structure.

One or more intervening layers, such as a sacrificial layer and/or an antireflection layer, may be formed on the dielectric layer 103 before the formation of the second mask material layer.

Referring to FIGS. 4, 14, 15, 16, 17, 18, and 19, the method may include the following steps: performing a removal process (e.g., an etching process) through the first portion 2021 of the designated structure 202 of the second mask 2021 and through the second portion of the designated structure 202 of the second mask 2021 for removing portions of the dielectric layer 103 to form a first contact hole 104 and a second contact hole (which may be analogous to the first contact hole 104) in the dielectric layer 103; and removing the second mask 2021 (and removing the one or more intervening layers underlying the second mask 2021). The first contact hole 104 and the second contact hole may expose the first electrode 1021 and the second electrode 1022, respectively.

During the removal process, two portions of the dielectric layer 103 respectively positioned under the first portion 2021 of the designated structure 202 and the second portion of the designated structure 202 may be removed, the third portion 2020 of the designated structure 202 may expose the portion of the first mask 2011 that is positioned under the third portion 202 of the designated structure 202, and the portion of the first mask 2011 may protect (or prevent) a portion of the dielectric layer 103 that is positioned under (and directly contacts) the portion of the first mask 2011 from being removed. The protected portion of the dielectric layer 103 may be positioned between the two removed portions of the dielectric layer 103 and subsequently positioned between the first contact hole 104 and the second contact hole. The protected portion of the dielectric layer 103 may substantially effectively define the spacing between the first contact hole 104 and the second contact hole. A width of the portion of the first mask 2011 may be equal to a distance between the first contact hole 104 and the second contact hole. A width of the protected portion of the dielectric layer 103 may be equal to a distance between the first contact hole 104 and the second contact hole. The protected portion of the dielectric layer 103 may also effectively enable a sufficient spacing between a subsequently formed third contact hole and each of the first contact hole 104 and the second contact hole. Therefore, unwanted bridging between contact holes and/or associated conductive material(s) may be substantially prevented.

During the removal process performed for forming the first contact hole 104 and the second contact hole, the intersections between edges of the first mask 2011 and edges of the designated structure 202 may substantially enable desirable the shapes of the corresponding corners of the first contact hole 104 and the second contact hole. Therefore, unwanted corner rounding may be substantially prevented.

According to embodiments of the invention, control of contact hole spacing and contact hole corner shapes may be substantially simplified. As a result, design requirements of semiconductor devices may be substantially satisfied. Advantageously, satisfactory quality of semiconductor devices may be substantially attained, and a satisfactory yield of the related manufacturing process may be substantially achieved.

The first contact hole 104 and the first electrode 1021 may be implemented for a first semiconductor device (e.g., a first transistor), and the second contact hole and the second electrode 1022 may be implemented for a second semiconductor device (e.g., a second transistor). Other contact holes also may be formed along with the first contact hole 104 and the second contact hole as a result of the removal process.

Referring to FIGS. 4, 17, 18, 19, 20, 21, and 22, the method may include the following steps: providing a metal silicide element 1041 in each of the first contact hole 104 and the second contact hole; and removing the first mask 201.

The metal silicide element 1041 may be formed of one or more of nickel silicide (NiSi), platinum silicide (PtSi), and other suitable materials. The metal silicide element 1041 may minimize contact resistance.

Referring to FIGS. 4, 20, 21, 22, 23, 24, and 25, the method may include the following step: forming a third mask 2031 on and/or over the remaining portion of the dielectric layer 103 (or the remaining dielectric layer), the first contact hole 104, and the second contact hole. The third mask 2031 may have a designated structure 203 (e.g., an opening or a transparent structure).

The formation of the third mask 2031 may include the following steps: forming a third mask material layer on and/or over the remaining portion of the dielectric layer 103, the first contact hole 104, and the second contact hole; forming a third pattern mask on the third mask material layer; and removing (e.g., through etching) one or more portions of the third mask material layer not protected by the third pattern mask.

The third mask 2031 (which has the designated structure 203) may be formed of one or more of a photoresist material and other suitable materials.

The lengthwise direction of the designated structure 203 may be parallel to the lengthwise direction of the first mask 2011 and/or may be perpendicular to the lengthwise direction of the designated structure 202.

One or more intervening layers, such as a sacrificial layer and/or an antireflection layer, may be formed on the dielectric layer 103 before the formation of the third mask material layer.

Referring to FIGS. 4, 23, 24, 25, 26, 27, and 28, the method may include the following step: performing a second removal process (e.g., an dry etching process or a wet etching process) through the designated structure 203 of the third mask 2031 for removing a portion of the remaining dielectric layer (or the previously remaining portion of the dielectric layer 103) to form a third contact hole 105; and removing the third mask 2031 (and removing the one or more intervening layers underlying the third mask 2031).

Referring to FIGS. 4, 26, 27, 28, 29, 30, and 31, the method may include the following step: providing a first conductive member 1061 (e.g., a metal member) in the first contact hole 104; providing a second conductive member (analogous to the first conductive member 1061) in the second contact hole; and providing a third conductive member 1062 (e.g., a metal member) in the third contact hole 105.

The first conductive member 1061, the second conductive member, and the third conductive member 1062 may be formed through a same deposition process and/or a same polishing process (e.g., a chemical-mechanical polishing process). The first conductive member 1061, the second conductive member, and the third conductive member 1062 may be formed substantially simultaneously. One or more of the first conductive member 1061, the second conductive member, and the third conductive member 1062 may be formed of one or more of tungsten and other suitable materials.

According to embodiments of the invention, in a process for manufacturing semiconductor devices, a mask and an overlying designated structure of another mask may substantially simplify the control of both contact hole spacings and contact hole corner shapes. Therefore, design requirements of semiconductor devices may be effectively satisfied. Advantageously, satisfactory quality of semiconductor devices may be substantially attained, and a satisfactory yield of the manufacturing process may be substantially achieved.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for manufacturing one or more semiconductor devices, the method comprising:
   providing a dielectric layer on a substrate structure, wherein the substrate structure includes a first electrode and a second electrode;
   providing a first mask on the dielectric layer;
   providing a second mask, which overlaps the first mask and has a first designated structure, wherein a portion of the first mask is positioned between a first portion of the first designated structure and a second portion of the first designated structure in a layout view of a process structure that includes the substrate structure, the dielectric layer, the first mask, and the second mask; and
   performing a first removal process through the first portion of the first designated structure and through the second portion of the first designated structure for removing portions of the dielectric layer to form a first contact hole and a second contact hole in a first remaining dielectric layer, which is a remaining portion of the dielectric layer, wherein the first contact hole and the second contact hole expose the first electrode and the second electrode, respectively.

2. The method of claim 1, wherein the first mask is formed of a first material, wherein the second mask is formed of a second material, and wherein the second material is different from the first material.

3. The method of claim 1, wherein an edge of the first designated structure intersects an edge of the first electrode and an edge of the second electrode in the layout view of the process structure.

4. The method of claim 1, further comprising:
   configuring the first electrode to be an active region electrode of a first semiconductor device; and
   configuring the second electrode to be an active region electrode of a second semiconductor device.

5. The method of claim 1, further comprising:
configuring the first electrode to be an active region electrode of a first transistor; and
configuring the second electrode to be an active region electrode of a second transistor.

6. The method of claim 1, wherein the first designated structure exposes the portion of the first mask during the first removal process.

7. The method of claim 1, wherein the portion of the first mask directly contacts a protected portion of the dielectric layer, and wherein the portion of the first mask protects the protected portion of the dielectric layer during the first removal process.

8. The method of claim 1, wherein each of a first edge of the first mask and a second edge of the first mask intersects two edges of the first designated structure in the layout view of the process structure, wherein the first edge of the first mask and the two edges of the first designated structure define shapes of two corners of the first contact hole, and wherein the second edge of the first mask and the two edges of the first designated structure define shapes of two corners of the second contact hole.

9. The method of claim 1, wherein the substrate structure further includes a first fin structure and a second fin structure, and wherein the first mask is positioned between the first fin structure and the second fin structure in the layout view of the process structure.

10. The method of claim 9, wherein the first designated structure intersects each of the first fin structure and the second fin structure in the layout view of the process structure.

11. The method of claim 10, wherein the substrate structure further includes a third fin structure, and wherein the first designated structure further intersects the third fin structure in the layout view of the process structure.

12. The method of claim 1, further comprising: forming an intervening layer on the first mask before forming the second mask, wherein the second mask is formed on the intervening layer, and wherein the intervening layer includes at least one of a sacrificial layer and an antireflection layer.

13. The method of claim 1, wherein the first mask is formed of titanium nitride.

14. The method of claim 1, wherein the second mask is formed of a photoresist material.

15. The method of claim 1, further comprising:
providing a first mask material layer on the dielectric layer;
providing a photoresist layer on the first mask material layer;
providing a pattern mask on the photoresist layer;
processing the photoresist layer through the pattern mask to form a patterned photoresist layer; and
processing the first mask material layer through the patterned photoresist layer to form the first mask.

16. The method of claim 1, further comprising:
providing a first metal silicide element in the first contact hole; and
providing a second metal silicide element in the second contact hole.

17. The method of claim 1, further comprising:
removing the second mask;
removing the first mask after the second mask has been removed;
providing a third mask on the first remaining dielectric layer after the first mask has been removed, wherein the third mask has a second designated structure; and
processing the first remaining dielectric layer through the second designated structure to form a third contact hole in a second remaining dielectric layer, which is a remaining portion of the first remaining dielectric layer, wherein the third contact hole exposes a third electrode included in the substrate structure.

18. The method of claim 17, wherein the first mask intersects the third electrode in the layout view of the process structure before the first mask is removed.

19. The method of claim 17, wherein a lengthwise direction of the second designated structure is parallel to a lengthwise direction of the first mask.

20. The method of claim 17, further comprising: simultaneously depositing a same conductive material in all of the first contact hole, the second contact hole, and the third contact hole.

* * * * *